(12) United States Patent
Kim et al.

(10) Patent No.: US 8,963,640 B2
(45) Date of Patent: Feb. 24, 2015

(54) AMPLIFIER FOR OUTPUT BUFFER AND SIGNAL PROCESSING APPARATUS USING THE SAME

(71) Applicant: Samsung Electronics Co., Ltd., Suwon-si (KR)

(72) Inventors: Hyung-Tae Kim, Hwaseong-si (KR); Soo-Ik Cha, Hwaseong-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 101 days.

(21) Appl. No.: 13/754,267

(22) Filed: Jan. 30, 2013

(65) Prior Publication Data

US 2013/0249635 A1 Sep. 26, 2013

(30) Foreign Application Priority Data

Mar. 21, 2012 (KR) .................. 10-2012-0028962

(51) Int. Cl.
*H03F 3/45* (2006.01)
*H03F 3/30* (2006.01)

(52) U.S. Cl.
CPC .......... *H03F 3/45179* (2013.01); *H03F 3/3028* (2013.01); *H03F 3/45219* (2013.01); *H03F 2200/456* (2013.01); *H03F 2203/45166* (2013.01)
USPC ....................................................... 330/261

(58) Field of Classification Search
CPC ........................................................ H03F 3/45
USPC ........................................ 330/259, 260, 261
See application file for complete search history.

(56) References Cited

U.S. PATENT DOCUMENTS

| 6,483,353 | B2 | 11/2002 | Kim et al. |
| 6,504,432 | B1 * | 1/2003 | Rokhsaz ................ 330/258 |
| 6,642,791 | B1 * | 11/2003 | Balan ..................... 330/253 |
| 7,088,628 | B2 | 8/2006 | Lee et al. |
| 7,271,653 | B2 | 9/2007 | Chung |
| 7,576,610 | B2 | 8/2009 | Dalena |
| 7,642,853 | B2 | 1/2010 | Dabag et al. |
| 2011/0169808 | A1 | 7/2011 | Son et al. |

FOREIGN PATENT DOCUMENTS

| JP | 1996-321734 | 12/1996 |
| JP | 2009-130621 | 6/2009 |
| KR | 2006-0088972 | 8/2006 |
| KR | 2010-0061283 | 6/2010 |

(Continued)

*Primary Examiner* — Steven J Mottola
(74) *Attorney, Agent, or Firm* — Muir Patent Consulting, PLLC

(57) ABSTRACT

An amplifier for an output buffer includes an operational amplifier including a first input terminal, a second input terminal, and an output terminal, the operational amplifier is configured to generate an input bias current and amplify a voltage difference between signals applied to the first input terminal and the second input terminal, and to output the amplified voltage difference; and a self-bias circuit connected to the first input terminal and the second input terminal, the self-bias circuit is configured to generate first and second current paths when the voltage difference is equal to or greater than a predetermined voltage, to generate a tail current on the first or second current path, and to add the generated tail current to the input bias current of the operational amplifier, wherein the second input terminal is connected to the output terminal.

20 Claims, 11 Drawing Sheets

(56) References Cited

FOREIGN PATENT DOCUMENTS

| KR | 2011-0073171 | 6/2011 |
| KR | 2011-0077349 | 7/2011 |
| KR | 2011-0098038 | 9/2011 |

\* cited by examiner

AMPLIFIER FOR OUTPUT BUFFER AND SIGNAL PROCESSING APPARATUS USING THE SAME

CROSS-REFERENCE TO RELATED APPLICATIONS

This application claims the benefit of Korean Patent Application No. 10-2012-0028962, filed on Mar. 21, 2012, in the Korean Intellectual Property Office, the disclosure of which is incorporated herein in its entirety by reference.

BACKGROUND

Example embodiments relate to an amplifier, and more particularly, to an amplifier for an output buffer and a signal processing apparatus using the amplifier.

An operational amplifier is an example of an amplifier that is used for an output buffer in a signal processing apparatus. The operational amplifier has two input terminals and one output terminal, amplifies a voltage difference between voltages applied to a first input terminal and a second input terminal, and outputs the amplified voltage difference. As a driving frequency of the signal processing apparatus increases, research for improving a slew rate of an amplifier for an output buffer may be useful.

SUMMARY

According to some embodiments, the disclosure provides an amplifier for an output buffer that may improve a slew rate of the amplifier by employing an adaptive-type self-bias circuit.

The disclosure also provides a signal processing apparatus using an amplifier for an output buffer that may improve a slew rate of the amplifier by employing an adaptive-type self-bias circuit.

According to one embodiment, there is provided an amplifier for an output buffer, the amplifier including: an operational amplifier including a first input terminal, a second input terminal, and an output terminal, the operational amplifier configured to generate an input bias current and amplify a voltage difference between signals applied to the first input terminal and the second input terminal, and to output the amplified voltage difference; and a self-bias circuit connected to the first input terminal and the second input terminal, the self-bias circuit configured to generate a first current path and a second current when the voltage difference between signals applied to the first input terminal and the second input terminal is equal to or greater than a predetermined voltage, to generate a tail current on the first or second current path and to add the generated tail current to the input bias current of the operational amplifier, wherein the second input terminal is connected to the output terminal.

If the voltage difference between signals applied to the first input terminal and the second input terminal is less than the predetermined voltage, both the first and second current paths may be cut off.

The self-bias circuit may add the tail current that is generated on the first or second current path to an input bias current of the operational amplifier by using a current mirror circuit.

According to another embodiment, there is provided a signal processing apparatus including: a digital-to-analog converter (DAC) configured to convert a digital image signal into an analog image signal; and an amplifier for an output buffer configured to amplify the analog image signal and to supply the amplified analog image signal to a display panel, wherein the amplifier includes: an operational amplifier including a first input terminal, a second input terminal, and an output terminal, the operational amplifier configured to generate an input bias current and amplify a voltage difference between signals applied to the first input terminal and the second input terminal, and to output the amplified voltage difference; and a self-bias circuit connected to the first input terminal and the second input terminal, the self-bias circuit configured to generate a first current path and a second current when the voltage difference between signals applied to the first input terminal and the second input terminal is equal to or greater than a predetermined voltage, to generate a tail current on the first or second current path, and to add the generated tail current to the input bias current of the operational amplifier, and wherein the second input terminal is connected to the output terminal.

According to further another embodiment, there is provided an amplifier circuit of a semiconductor device. The amplifier circuit including: an operational amplifier comprising an input circuit including a first input terminal, a second input terminal, a first node, and a second node, and an output terminal, the operational amplifier configured to amplify a voltage difference between a first input voltage applied to the first input terminal and a second input voltage applied to the second input terminal, and configured to output the amplified voltage difference through the output terminal; a first self-bias circuit connected to the first input terminal, the second input terminal, the first node, and the second node, the first self-bias circuit configured to generate a first current path when a second input voltage applied to the second input terminal is greater than a first input voltage applied to the first input terminal; and a second self-bias circuit connected to the first input terminal, the second input terminal, the first node, and the second node, the second self-bias circuit configured to generate a second current path when a first input voltage applied to the first input terminal is greater than a second input voltage applied to the second input terminal, wherein the second input terminal is connected to the output terminal.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Figure 1:
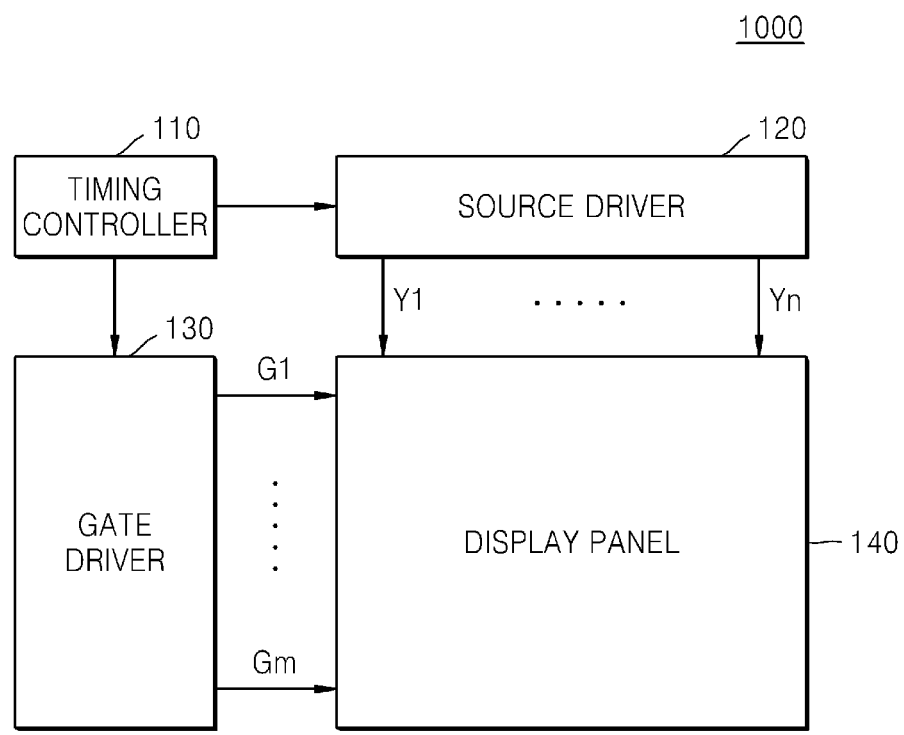
FIG. 1 is a block diagram of a structure of a display system according to one embodiment.

Example embodiments of the present disclosure will be described more fully with reference to the accompanying drawings.

The disclosure may, however, be embodied in many different forms and should not be construed as being limited to the embodiments set forth herein. Like reference numerals refer to like elements. In the drawings, elements may be enlarged compared to their actual sizes for convenience of explanation, and ratios of the elements may be exaggerated or reduced.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, A, B, etc. may be used herein in reference to elements of the disclosure, such elements should not be construed as limited by these terms unless the context indicates otherwise. For example, a first element could be termed a second element, and a second element could be termed a first element, without departing from the scope of the present disclosure. Herein, the term "and/or" includes any and all combinations of one or more referents.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a structure of a display system 1000 according to one embodiment.

As illustrated in FIG. 1, the display system 1000 includes a timing controller 110, a source driver 120, a gate driver 130, and a display panel 140.

The display panel 140 may be, for example, a liquid crystal display (LCD) panel. The timing controller 110 generates a control signal used in controlling the source driver 120 and the gate driver 130 and processes image data received from outside so as to transmit the processed image data to the source driver 120.

The source driver 120 may receive the image data provided by the timing controller 120, may generate analog grey scale signals corresponding to the received image data, and may output the analog grey scale signals to source lines Y1 to Yn of the display panel 140.

The gate driver 130 enables gate lines G1 to Gm of the display panel 140 sequentially in response to control signals supplied by the timing controller 120.

Thus, in each of a plurality of liquid crystal cells arranged in the enabled gate lines G1 to Gm of the display panel 140, optical characteristics of liquid crystal are adjusted according to voltages of the analog grey scale signals applied to the source lines Y1 to Yn so that an image may be displayed.

Figure 2:
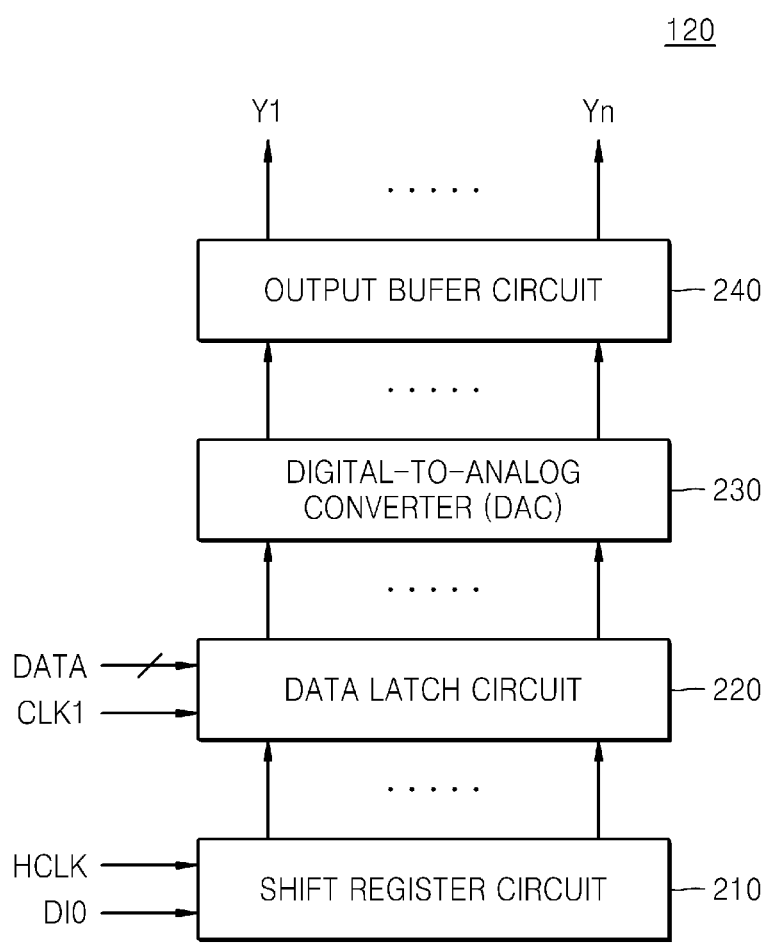
FIG. 2 illustrates a structure of a source driver illustrated in FIG. 1, according to an exemplary embodiment.

FIG. 2 illustrates a structure of the source driver 120 illustrated in FIG. 1, according to an exemplary embodiment.

As illustrated in FIG. 2, the source driver 120 includes a shift register circuit 210, a data latch circuit 220, a digital-to-analog converter (DAC) 230, and an output buffer circuit 240.

The shift register circuit 210 controls a time at which pieces of digital image data DATA are sequentially stored in the data latch circuit 220. The shift register circuit 210 shifts a horizontal start signal DIO that is received in response to a clock signal HCLK.

The data latch circuit 220 receives and stores the digital image data DATA transmitted from the timing controller 110 (see FIG. 1) in response to the horizontal start signal DIO. When storing of the image data DATA corresponding to one horizontal line is completed, the data latch circuit 220 may output the image data DATA in response to an output control signal CLK1.

The DAC 230 receives the digital image data DATA that is output from the data latch circuit 220, and outputs analog grey scale signals corresponding to the data image data DATA in response to the output control signal CLK1.

The output buffer circuit 240 buffers the analog grey scale signals that are output by the DAC 230, and outputs the buffered analog grey scale signals.

Figure 3:
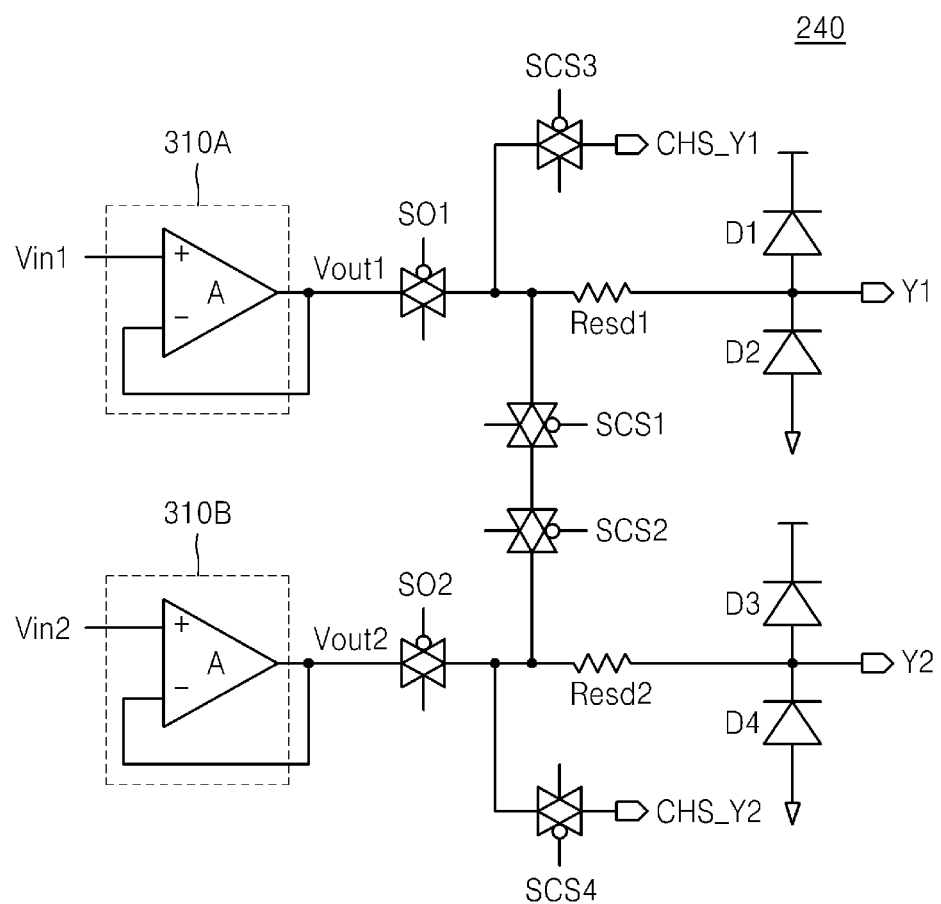
FIG. 3 illustrates a structure of an output buffer circuit illustrated in FIG. 2, according to an exemplary embodiment.

FIG. 3 illustrates a structure of the output buffer circuit 240 illustrated in FIG. 2, according to an exemplary embodiment.

As illustrated in FIG. 3, the output buffer circuit 240 may include amplifiers 310A and 310B for an output buffer, output control switches SO1 and SO2, share switches SCS1 to SCS4, resistors Resd1 and Resd2, and diodes D1 to D4.

A grey scale voltage that is to be applied to a first data line of the display panel 140 (see FIG. 1) as an input voltage Vin1 is applied to the amplifier 310A for an output buffer. The amplifier 310A for an output buffer buffers the input voltage Vin1 and outputs the buffered input voltage Vin1 as a first driving voltage Vout1.

A grey scale voltage that is to be applied to a second data line of the display panel 140 (see FIG. 1) as an input voltage Vin2 is applied to the amplifier 310B for an output buffer. The amplifier 310B for an output buffer buffers the input voltage Vin2 and outputs the buffered input voltage Vin2 as a second driving voltage Vout2.

The output buffer circuit 240 performs a buffering operation by using the amplifiers 310A and 310B having a good current driving capability so that, when a load current flowing through a load, for example, a data line of the display panel 140 and a pixel capacitor, is increased, the output buffer circuit 240 may supply an output signal at a predetermined voltage level.

The output control switches SO1 and SO2 are switches for controlling the supply of an output signal from the amplifier 310A or 310B for an output buffer to the first data line or the second data line of the display panel 140.

The share switches SCS1 to SCS4 form charge share paths. A charge share function allows data lines of the display panel 140 to be temporarily connected to one another when gate lines to be driven, i.e., lines to be displayed, are changed and allows the data lines to share charges. Thus, a driving burden of the amplifiers 310A and 310B that drive the data lines may be reduced.

The resistors Resd1 and Resd2 are elements that protect internal devices from static electricity. The diodes D1 to D4 are also elements that protect internal devices from static electricity when high voltages are applied to output pads Y1 and Y2.

Figure 4:
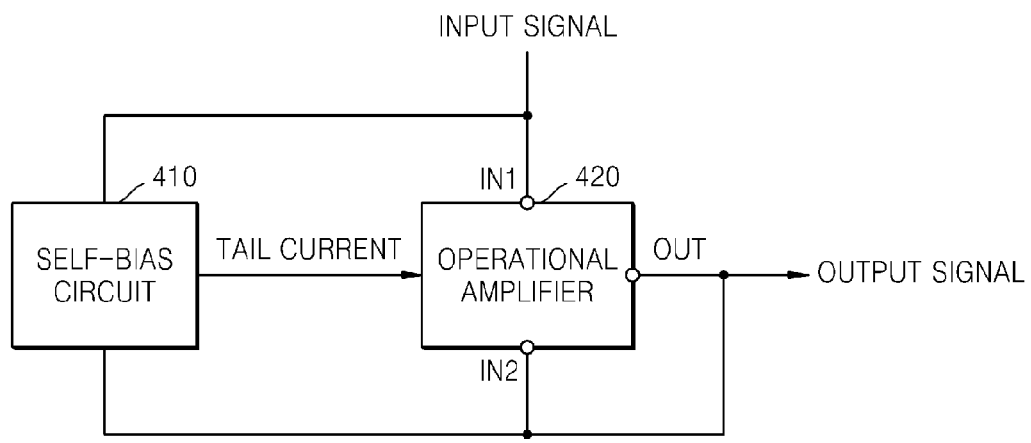
FIG. 4 illustrates a structure of an amplifier for the output buffer circuit illustrated in FIG. 3, according to one embodiment.

FIG. 4 illustrates a structure of the amplifier 310A or 310B for the output buffer circuit 240 illustrated in FIG. 3, according to one embodiment. However, the amplifier 310A or 310B illustrated in FIG. 4 is not limited to being applied to a source driver and may be applied to an output buffer for various electronic devices, for example, a regulator, a power booster, various driver circuits, and the like.

As illustrated in FIG. 4, the amplifier 310A or 310B according to the present embodiment may include a self-bias circuit 410 and an operational amplifier 420.

The self-bias circuit 410 may include first and second current paths that are connected to a first input terminal IN1 and a second input terminal IN2 of the operational amplifier 420, respectively. When a voltage difference between signals applied to the first input terminal IN1 and the second input terminal IN2 is equal to or greater than a predetermined voltage (e.g., $V=Vthn+|Vthp|$, $Vthn=$a threshold voltage of either "an NMOS transistor" or "NMOS transistors" connected to the first input terminal IN1, $Vthp=$a threshold voltage of either "a PMOS transistor" or "PMOS transistors" connected to the second input terminal IN2), the self-bias circuit 410 generates a tail current on the first current path or the second current path and transmits the generated tail current to the operational amplifier 420.

The operational amplifier 420 may include the first input terminal IN1, the second input terminal IN2, and an output terminal OUT. The operational amplifier 420 amplifies a voltage difference between signals applied to the first input terminal IN1 and the second input terminal IN2 based on a bias current to which the tail current transmitted from the self-bias circuit 410 is added, and outputs the amplified voltage difference to the output terminal OUT.

The second input terminal IN2 of the operational amplifier 420 of the amplifier 310A or 310B for an output buffer may be connected to the output terminal OUT.

Figure 5:
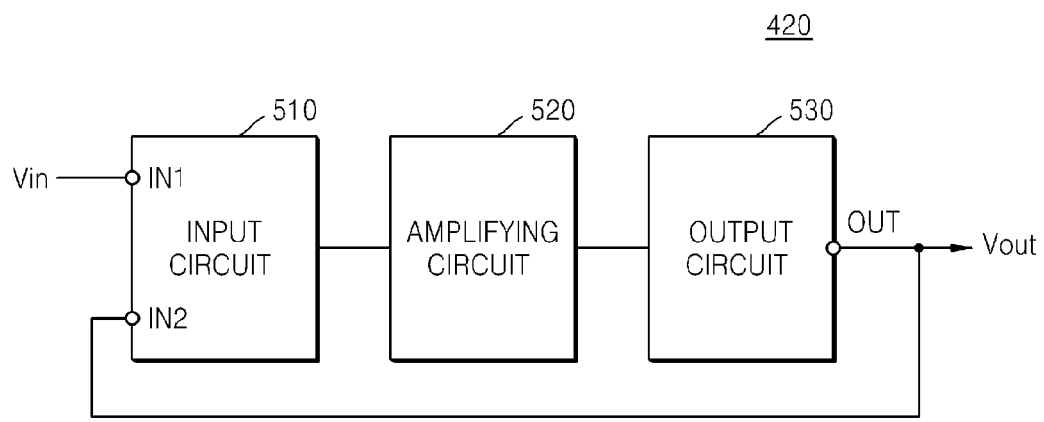
FIG. 5 is a block diagram of a structure of an operational amplifier illustrated in FIG. 4, according to one embodiment.

FIG. 5 is a block diagram of a structure of the operational amplifier 420 illustrated in FIG. 4, according to one embodiment.

As illustrated in FIG. 5, the operational amplifier 420 may include an input circuit 510, an amplifying circuit 520, and an output circuit 530.

The input circuit 510 outputs a differential current caused by the voltage difference between the signals applied to the first input terminal IN1 and the second input terminal IN2 based on the bias current to which the tail current generated by the self-bias circuit 410 is added. The second input terminal IN2 of the input circuit 510 is connected to the output terminal OUT of the output circuit 530. Thus, the input circuit 510 outputs the differential current caused by the voltage difference between an input voltage Vin applied to the first input terminal IN1 and an output voltage Vout applied to the second input terminal IN2. For example, the first input terminal IN1 may be a positive terminal (+), and the second input terminal IN2 may be a negative terminal (−). Alternatively, the first input terminal IN1 may be a negative terminal (−), and the second input terminal IN2 may be a positive terminal (+).

The amplifying circuit 520 adds the differential current output from the input circuit 510 and amplifies a voltage caused by the added differential current.

The output circuit 530 outputs the output voltage Vout output from the amplifying circuit 520 to the output terminal OUT.

Figure 6:
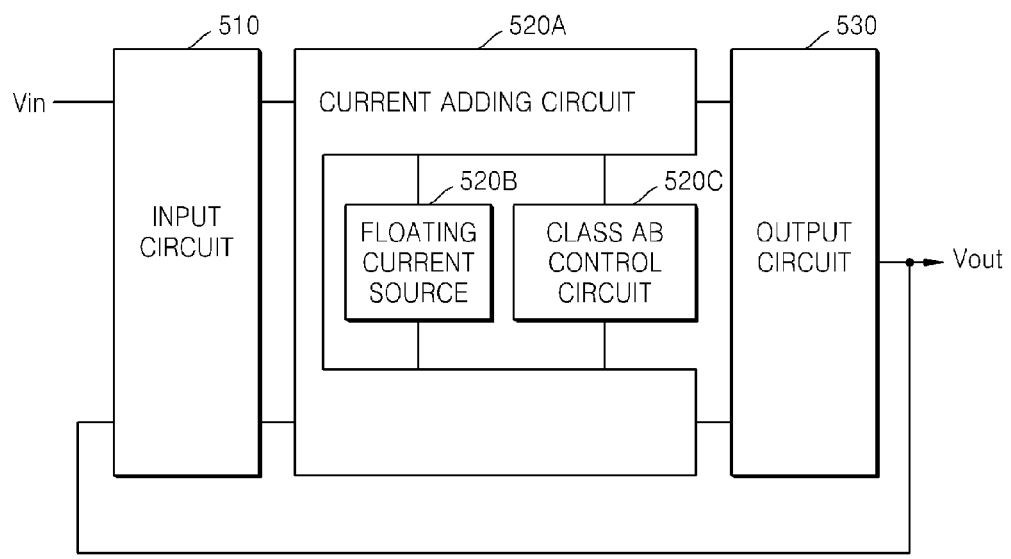
FIG. 6 is a detailed block diagram of the amplifying circuit illustrated in FIG. 5, according to one embodiment.

FIG. 6 is a detailed block diagram of the amplifying circuit 520 illustrated in FIG. 5, according to one embodiment.

As illustrated in FIG. 6, the amplifying circuit 520 may include a current adding circuit 520A, a floating current source 520B, and a class AB control circuit 520C.

The current adding circuit 520A adds the differential current output from two pairs of differential transistors of the input circuit 510.

The floating current source 520B controls the amplifying circuit 520 to generate a predetermined bias current by receiving a bias voltage.

The class AB control circuit 520C increases a gain of the operational amplifier 420.

A detailed circuit structure of the operational amplifier 420 included in the amplifier 310A or 310B for an output buffer illustrated in FIG. 4 will now be described.

Figure 7:
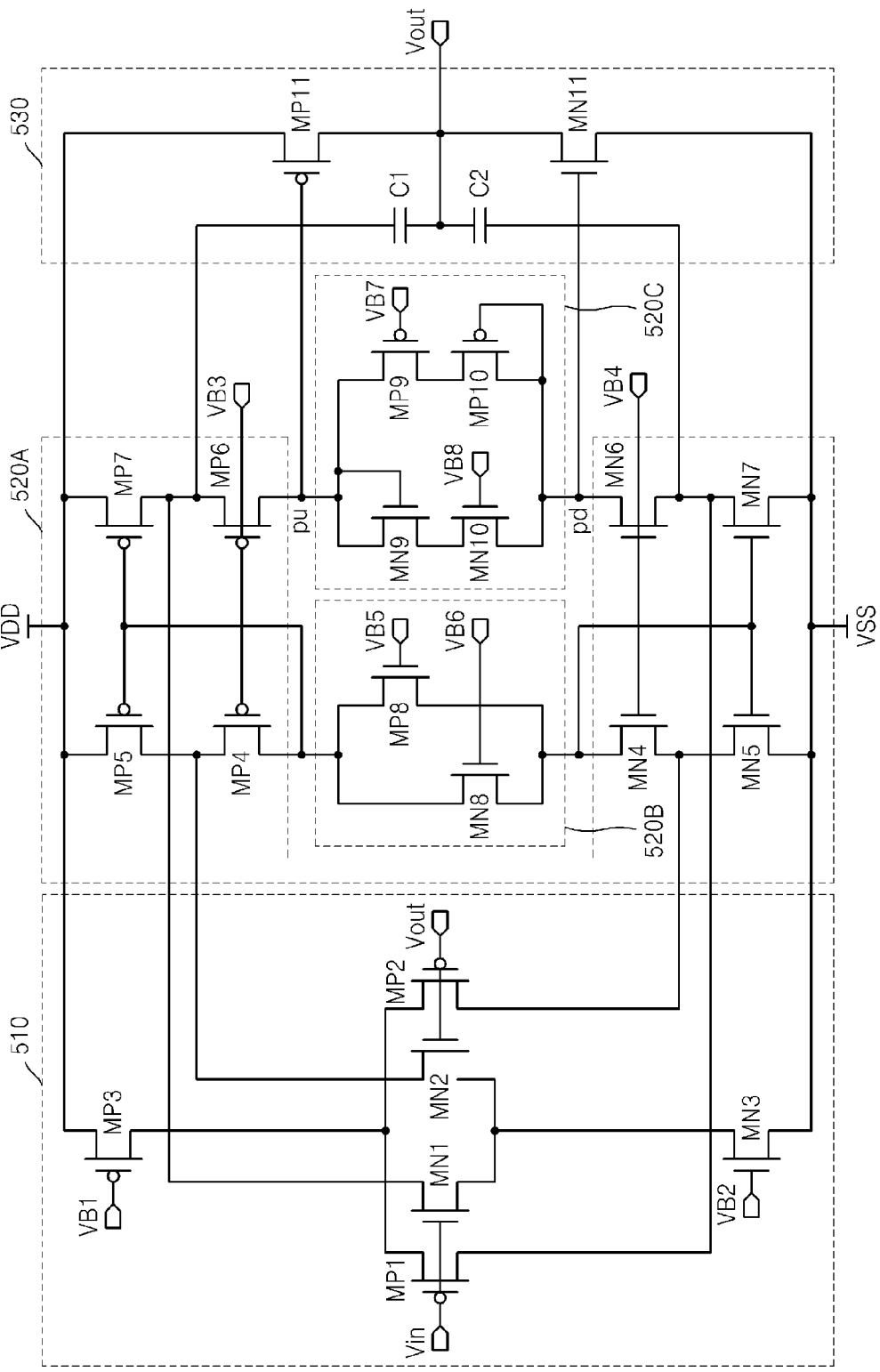
FIG. 7 illustrates a detailed circuit structure of the operational amplifier of FIG. 4, according to one embodiment.

FIG. 7 illustrates the detailed circuit structure of the operational amplifier 420 of FIG. 4, according to one embodiment.

The input circuit 510 (see FIG. 5) is a folded cascade operational transconductance amplifier (OTA). The folded cascade OTA converts a voltage difference into a current and transmits the current.

The input circuit 510 may include PMOS transistors MP1, MP2, and MP3 and NMOS transistors MN1, MN2, and MN3 and outputs the differential current by receiving the input voltage Vin and the output voltage Vout.

The input circuit 510 may include a first differential input circuit composed of a PMOS transistor MP1 and a transistor MP2 and a second differential input circuit composed of the NMOS transistor MN1 and the NMOS transistor MN2. The PMOS transistor MP3 and the NMOS transistor MN3 supply a bias current to the first differential input circuit and the second differential input circuit, respectively.

The PMOS transistor MP3 applies a first bias current to the first differential input circuit according to a first bias voltage VB1, and the NMOS transistor MN3 applies a second bias current to the second differential input circuit according to a second bias voltage VB2.

Each of the first differential input circuit and the second differential input circuit separates the first and second bias current according to a differential input signal and outputs the separated current as a differential current to the current adding circuit 520A.

That is, the input circuit 510 converts a voltage difference between the input voltage Vin and the output voltage Vout into a current and outputs the current to the current adding circuit 520A.

Referring to FIGS. 4 through 7, the input circuit 510 may include a first pair of differential amplifying transistors MP1 and MP2 that are connected to a first branch through which a first bias current flows, and a second pair of differential amplifying transistors MN1 and MN2 that are connected to a second branch through which a second bias current flows. In this regard, a branch through which the tail current generated by the self-bias circuit 410 flows may be connected in parallel to the first branch or the second branch.

The current adding circuit 520A is a current mirror circuit composed of PMOS transistors MP4, MP5, MP6, and MP7 and NMOS transistors MN4, MN5, MN6, and MN7.

The current adding circuit 520A adds the differential current input from the input circuit 510. The NMOS transistors MN4, MN5, MN6, and MN7 of the current adding circuit 520A are connected to the first differential input circuit, and the PMOS transistors MP4, MP5, MP6, and MP7 are connected to the second differential input circuit.

The PMOS transistor MP4 and the PMOS transistor MP5 are connected in series between a power supply voltage VDD and the floating current source 520B, and the PMOS transistor MP6 and the PMOS transistor MP7 are connected in series between the power supply voltage VDD and the class AB control circuit 520C. The NMOS transistor MN4 and the NMOS transistor MN5 are connected in series between a ground terminal VSS and the floating current source 520B, and the NMOS transistor MN6 and the NMOS transistor MN7 are connected in series between the ground terminal VSS and the class AB control circuit 520C. A third bias voltage VB3 is applied to a gate terminal of each of the PMOS transistors MP4 and MP6, and a fourth bias voltage VB4 is applied to a gate terminal of each of the NMOS transistors MN4 and MN6.

The floating current source 520B has a configuration in which a PMOS transistor MP8 and an NMOS transistor MN8 are connected in parallel. Each of the PMOS transistor MP8 and the NMOS transistor MN8 generates a predetermined static bias current by receiving a fifth bias voltage VB5 and a sixth bias voltage VB6, respectively. The floating current source 520B may be composed of a single current source, instead of the PMOS transistor MP8 and the NMOS transistor MN8.

The class AB control circuit 520C has a configuration in which PMOS transistors MP9 and MP10 are connected in parallel with NMOS transistors MN9 and MN10. A seventh bias voltage VB7 is applied to a gate terminal of the PMOS transistor MP9, and an eighth bias voltage VB8 is applied to a gate terminal of the NMOS transistor MN10. A gate terminal and a drain terminal of each of the NMOS transistor MN9 and the PMOS transistor MP10 are connected to each other. Thus, the NMOS transistor MN9 and the PMOS transistor MP10 perform an operation of a circuit, such as a diode.

If the NMOS transistor MN9 and the PMOS transistor MP10 are not provided, when the operational amplifier 420 is driven with a high voltage, a gain of the operational amplifier 420 is decreased. That is, when the power supply voltage VDD of the operational amplifier 420 is high, a difference between voltages applied to a pull-up node pu and a pull-down node pd increases. This results in increasing a drain-source voltage of each of the PMOS transistor MP9 and the NMOS transistor MN10. An increase in the drain-source voltage causes a breakdown phenomenon of the PMOS transistor MP9 and the NMOS transistor MN10. The breakdown phenomenon results in rapidly decreasing a small signal resistance generated in the drain terminal of each of the PMOS transistor MP9 and the NMOS transistor MN10. Since the small signal resistance is proportional to a gain of an amplifier, a decrease in the small signal resistance is related with a decrease in the gain of the amplifier.

Thus, when the NMOS transistor MN9 is connected to the NMOS transistor MN10 in series and the PMOS transistor MP10 is connected to the PMOS transistor MP9 in series, the difference between the voltages applied to the pull-up node pu and the pull-down node pd may be dispersed. This results in decreasing the drain-source voltage of each of the PMOS transistors MP9 and MP10 and the NMOS transistors MN9 and MN10 so that the small signal resistance may be increased. An increase in the small signal resistance is related with an increase in the gain of the amplifier so that the gain of the operational amplifier 420 may be boosted.

In addition, when a large gain is generated by the operational amplifier 420, the NMOS transistor MN9 and the PMOS transistor MP10 prevent an output voltage from being distorted due to parasitic capacitance components between peripheral circuits.

The output circuit 530 may include capacitors C1 and C2, a PMOS transistor MP11, and an NMOS transistor MN11. The output circuit 530 generates an output signal by receiving an amplified voltage output from the class AB control circuit 520C. The capacitors C1 and C2 stabilize frequency characteristics of the output signal. That is, the capacitors C1 and C2 may prevent the output signal from oscillating.

A source terminal of the PMOS transistor MP11 of the output circuit 530 is connected to the power supply voltage VDD, a gate terminal of the PMOS transistor MP11 of the output circuit 530 is connected to the pull-up node pu, and a drain terminal of the PMOS transistor MP11 of the output circuit 530 is connected to the output terminal OUT and a drain terminal of the NMOS transistor MN11. A source terminal of the NMOS transistor MN11 is connected to the ground terminal VSS, a gate terminal of the NMOS transistor MN11 is connected to the pull-down node pd, and the drain terminal of the NMOS transistor MN11 is connected to the output terminal OUT and the drain terminal of the PMOS transistor MP11.

The above-described input circuit 510 is biased by the first and second bias voltages VB1 and VB2 so that a slew rate of an amplifier for an output buffer may be expressed as Equation 1:

$$\text{Slew Rate} = (I_{DCbias})/C_c \tag{1}$$

where $I_{DCbias}$ is a DC bias current value that is generated by the first or second bias voltage VB1 or VB2, and $C_c$ is a capacitance value of the capacitor C1 or C2 of the output circuit 530.

The present disclosure provides a scheme for improving a slew rate of the amplifier for an output buffer by combining the self-bias circuit 410 with the operational amplifier 420, as illustrated in FIG. 4.

Figure 8:
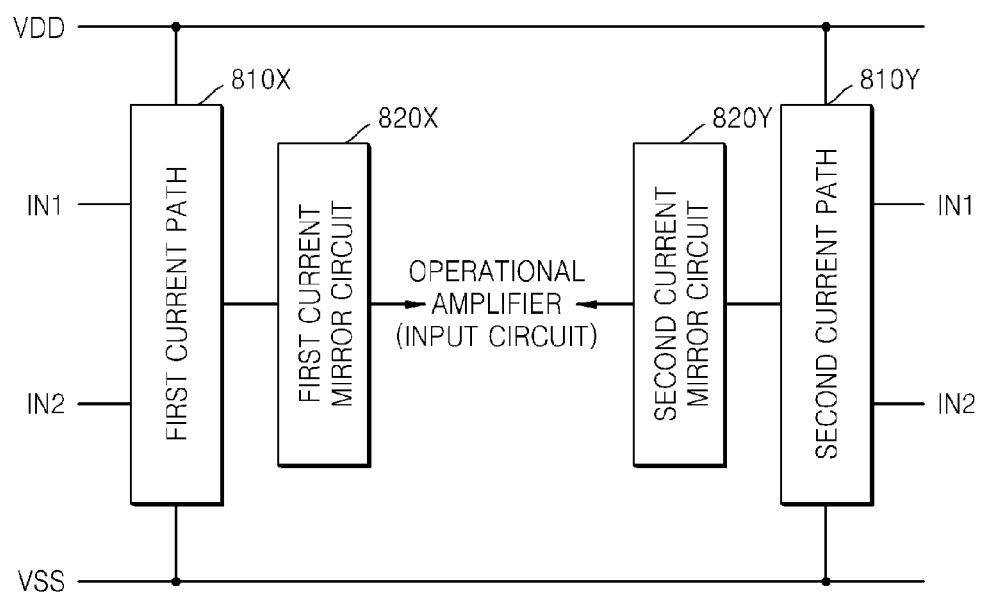
FIG. 8 is a block diagram of a structure of a self-bias circuit illustrated in FIG. 4, according to one embodiment.

FIG. 8 is a block diagram of a structure of the self-bias circuit 410 illustrated in FIG. 4, according to one embodiment.

As illustrated in FIG. 8, the self-bias circuit 410 includes a circuit that generates first and second current paths 810X and 810Y, and first and second current mirror circuits 820X and 820Y.

Each of the first and second current paths 810X and 810Y is formed between a power rail VDD (e.g., power supply voltage VDD) and a ground rail VSS (e.g., ground terminal VSS). Each of the first and second current paths 810X and 810Y is connected to the first input terminal IN1 and the second input terminal IN2 of the operational amplifier 420. Since the second input terminal IN2 of the operational amplifier 420 of the amplifier for an output buffer is connected to the output terminal OUT, a voltage of the signal applied to the second input terminal IN2 is the output voltage Vout output from the output terminal OUT, and a voltage of the signal applied to the first input terminal IN1 is the input voltage Vin.

In one embodiment, on each of the first and second current paths 810X and 810Y, a plurality of transistors may be connected between the power rail VDD and the ground rail VSS in a cascade structure, and at least one pair of an NMOS transistor and a PMOS transistor may be designed to share a source terminal in the cascade structure. For example, the first input terminal IN1 may be connected to a gate terminal of the NMOS transistor included in the pair of an NMOS transistor and a PMOS transistor that share the source terminal, and the second input terminal IN2 may be connected to a gate terminal of the PMOS transistor included in the pair of an NMOS transistor and a PMOS transistor that share the source terminal. In addition, the second input terminal IN2 may be connected to a gate terminal of the NMOS transistor included in the pair of an NMOS transistor and a PMOS transistor that share the source terminal, and the first input terminal IN1 may be connected to a gate terminal of the PMOS transistor included in one pair of NMOS transistor and PMOS transistor that share the source terminal.

In another embodiment, on each of the first and second current paths 810X and 810Y, a plurality of transistors are connected between the power rail VDD and the ground rail VSS in a cascade structure, and a circuit may be designed to connect the first input terminal IN1 to a gate terminal of one transistor connected in the cascade structure and to connect the second input terminal IN2 to a source terminal of the one transistor connected in the cascade structure.

The self-bias circuit 410 may generate a tail current on the first current path 810X or the second current path 810Y when a difference between voltages of the signals applied to the first input terminal IN1 and the second input terminal IN2 is equal to or greater than a predetermined voltage (e.g., V=Vthn+ |Vthp|, Vthn=a threshold voltage of either "an NMOS transistor" or "NMOS transistors" connected to the first input terminal IN1, Vthp=a threshold voltage of either "a PMOS transistor" or "PMOS transistors" connected to the second input terminal IN2). When the difference between voltages of the signals applied to the first input terminal IN1 and the second input terminal IN2 is less than the predetermined voltage, both the first and second current paths 810X and 810Y may be cut off.

The tail current that is generated on the first current path 810X may be transmitted to the input circuit 510 of the operational amplifier 420 via the first current mirror circuit 820X, and the tail current that is generated on the second current path 810Y may be transmitted to the input circuit 510 of the operational amplifier 420 via the second current mirror circuit 820Y. In detail, the tail currents that are generated on the first and second current paths 810X and 810Y may be added to an input bias current that is generated by the input circuit 510 of the operational amplifier 420 via the first and second current mirror circuits 820X and 820Y.

Now, circuit structures of the self-bias circuit 410 according to various embodiments will be described in detail.

Figure 9:
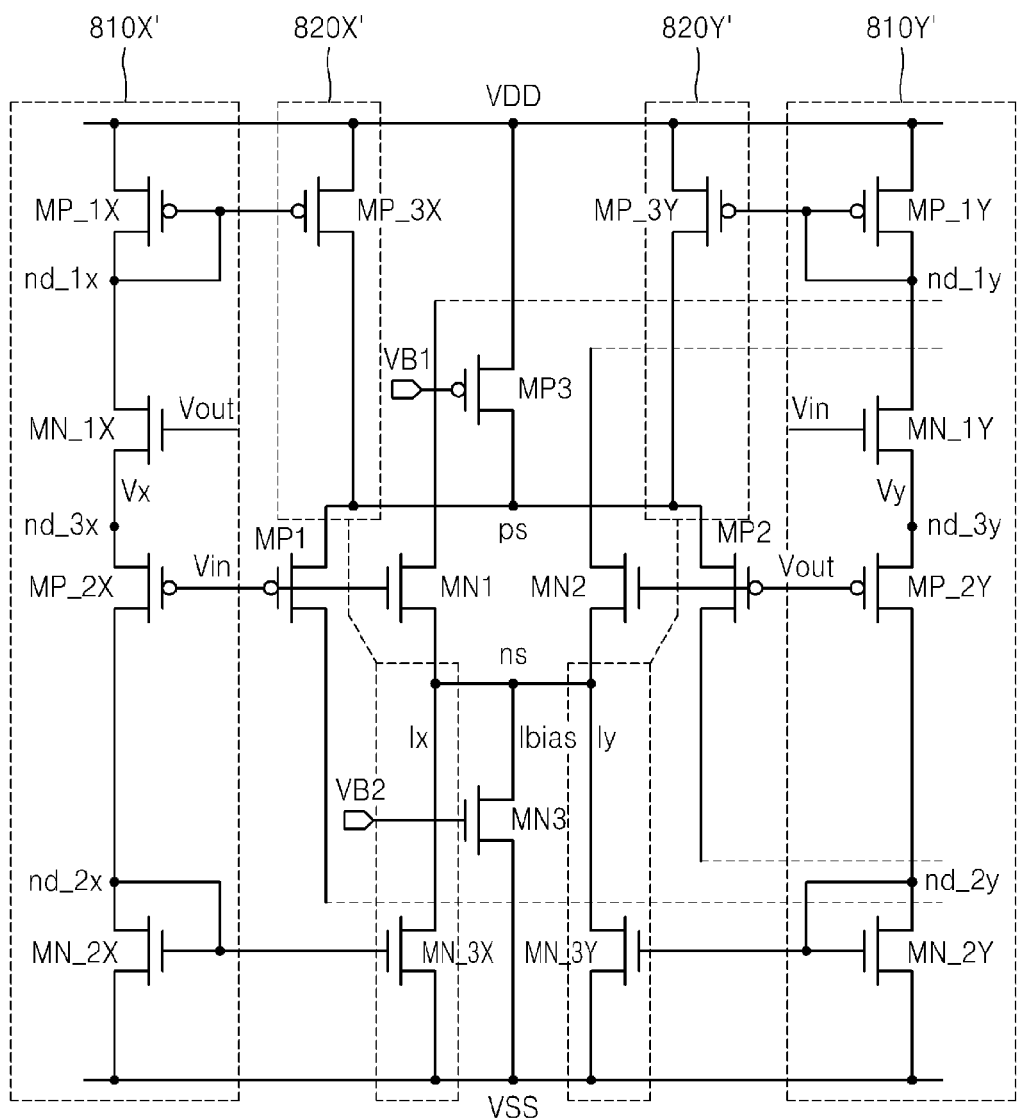
FIG. 9 illustrates a detailed circuit structure of the self-bias circuit of FIG. 4 that is connected to an input circuit of the operational amplifier of FIG. 4, according to one embodiment.

FIG. 9 illustrates a detailed circuit structure of the self-bias circuit 410 of FIG. 4 that is connected to an input circuit of the operational amplifier of FIG. 4, according to one embodiment.

The detailed circuit structure of the self-bias circuit 410 that is connected to the input circuit 510 of the operational amplifier 420 illustrated in FIG. 9 will now be described. The input circuit of FIG. 5 is included in FIG. 9 for convenience of explanation.

In one embodiment, on a first current path 810X', four transistors, for example, PMOS transistors MP_1X and MP_2X and NMOS transistors MN_1X and MN_2X, are connected between a power rail VDD and a ground rail VSS in a cascade structure.

A source terminal of the PMOS transistor MP_1X is connected to the power rail VDD, a gate terminal and a drain terminal of the PMOS transistor MP_1X are connected to a node nd_1x, a drain terminal of the NMOS transistor MN_1X is connected to the node nd_1x, a source terminal of the NMOS transistor MN_1X is connected to a node nd_3x, a gate terminal of the NMOS transistor MN_1X is connected to the second input terminal IN2, a source terminal of the PMOS transistor MP_2X is connected to the node nd_3x, a drain terminal of the PMOS transistor MP_2X is connected to a node nd_2x, a gate terminal of the PMOS transistor MP_2X is connected to the first input terminal IN1, a gate terminal and a drain terminal of the NMOS transistor MN_2X are connected to the node nd_2x, and a source terminal of the NMOS transistor MN_2X is connected to the ground rail VSS.

Since the input voltage Vin is applied to the first input terminal IN1 and the output voltage Vout is applied to the second input terminal IN2, the output voltage Vout is applied to the gate terminal of the NMOS transistor MN_1X, and the input voltage Vin is applied to the gate terminal of the PMOS transistor MP 2x.

In one embodiment, on a second current path 810Y', four transistors, for example, PMOS transistors MP_1Y and MP_2Y and NMOS transistors MN_1Y and MN_2Y, are connected between the power rail VDD and the ground rail VSS in a cascade structure.

A source terminal of the PMOS transistor MP_1Y is connected to the power rail VDD, a gate terminal and a drain terminal of the PMOS transistor MP_1Y are connected to a node nd_1y, a drain terminal of the NMOS transistor MN_1Y is connected to the node nd_1y, a source terminal of the NMOS transistor MN_1Y is connected to a node nd_3y, a gate terminal of the NMOS transistor MN_1Y is connected to the second input terminal IN2, a source terminal of the PMOS transistor MP_2Y is connected to the node nd_3y, a drain terminal of the PMOS transistor MP_2Y is connected to a node nd_2y, a gate terminal of the PMOS transistor MP_2Y is connected to the first input terminal IN1, a gate terminal and a drain terminal of the NMOS transistor MN_2Y are connected to the node nd_2y, and a source terminal of the NMOS transistor MN_2Y is connected to the ground rail VSS.

Since the input voltage Vin is applied to the first input terminal IN1 and the output voltage Vout is applied to the second input terminal IN2, the input voltage Vin is applied to the gate terminal of the NMOS transistor MN_1Y, and the output voltage Vout is applied to the gate terminal of the PMOS transistor MP_2Y.

In one embodiment, a PMOS transistor MP_3X and an NMOS transistor MN_3X of a first current mirror circuit 820X' that are combined with the PMOS transistor MP_1X and the NMOS transistor MN_2X of the first current path 810X', respectively, add the tail current that is generated on the first current path 810X' to an input bias current of the input circuit 510.

In detail, a source terminal of the PMOS transistor MP_3X is connected to the power rail VDD, a gate terminal of the PMOS transistor MP_3X is connected to the node nd_1x, a drain terminal of the PMOS transistor MP_3X is connected to a node ps, a source terminal of the NMOS transistor MN_3X is connected to the ground rail VSS, a gate terminal of the NMOS transistor MN_3X is connected to the node nd_2x, and a drain terminal of the NMOS transistor MN_3X is connected to a node ns.

The bias current caused by the first bias voltage VB1 and the tail current that is measured by the PMOS transistor MP_3X are applied to the node ps. Thus, the tail current may be added to the bias current caused by the first bias voltage VB1.

The bias current caused by the second bias voltage VB2 and the tail current that is formed by the NMOS transistor MN_3X are applied to the node ns. Thus, the tail current may be added to the bias current caused by the second bias voltage VB2.

In one embodiment, a PMOS transistor MP_3Y and an NMOS transistor MN_3Y of a second current mirror circuit 820Y' that are combined with the PMOS transistor MP_1Y and the NMOS transistor MN_2Y of the second current path 810Y' add the tail current that is generated on the second current path 810Y' to the input bias current of the input circuit 510.

In detail, a source terminal of the PMOS transistor MP_3Y is connected to the power rail VDD, a gate terminal of the PMOS transistor MP_3Y is connected to the node nd_1y, a drain terminal of the PMOS transistor MP_3Y is connected to the node ps, a source terminal of the NMOS transistor MN_3Y is connected to the ground rail VSS, a gate terminal of the NMOS transistor MN_3Y is connected to the node nd_2y, and a drain terminal of the NMOS transistor MN_3Y is connected to the node ns.

The bias current caused by the first bias voltage VB1 and the tail current that is formed by the PMOS transistor MP_3Y are applied to the node ps. Thus, the tail current may be added to the bias current caused by the first bias voltage VB1.

The bias current caused by the second bias voltage VB2 and the tail current that is formed by the NMOS transistor MN_3Y are applied to the node ns. Thus, the tail current may be added to the bias current caused by the second bias voltage VB2.

Now, an operation of generating the tail current on the first and second current paths 810X' and 810Y' will be described.

On the first current path 810X', if a gate-source voltage Vgs of the NMOS transistor MN_1X is equal to or greater than a threshold voltage Vthn of the NMOS transistor MN_1x, the NMOS transistor MN_1X electrically connects the node nd_1x and the node nd_3x, and if not, the NMOS transistor MN_1X does not electrically connect the node nd_1x, the node nd_3x.

Thus, conditions for electrical connection of the NMOS transistor MN_1X may be expressed as Inequality 2:

$$Vout-Vx \geq Vthn \quad (2),$$

where Vx is a voltage that is detected from the node nd_3X illustrated in FIG. 9, and Vthn is a threshold voltage of the NMOS transistor MN_1X.

Conditions for electrical connection of the PMOS transistor MP_2X may be expressed as Inequality 3:

$$Vx-Vin \geq |Vthp| \quad (3),$$

where Vthp is a threshold voltage of the PMOS transistor MP_2X.

In order to enable electrical connection of the first current path 810X', Inequalities 2 and 3 that are conditions for electrical connection of the NMOS transistor MN_1X and the PMOS transistor MP_2X need to be satisfied.

Thus, conditions for electrical connection of the first current path 810X' may be expressed as Inequality 4:

$$Vout-Vin \geq Vthn+|Vthp| \quad (4)$$

On the conditions shown in Equation 5, the first current path 810X' is cut off.

$$Vout-Vin < Vthn+|Vthp| \quad (5)$$

Next, on the second current path 810Y', when the gate-source voltage Vgs of the NMOS transistor MN_1Y is equal to or greater than a threshold voltage Vthn of the NMOS transistor MN_1Y, electrical connection of the NMOS transistor MN_1Y is formed, and if not, the NMOS transistor MN_1Y is cut off.

Thus, the NMOS transistor MN_1Y may be expressed as Inequality 6:

$$Vin-Vy \geq Vthn \quad (6),$$

where Vy is a voltage that is detected from the node nd_3y illustrated in FIG. 9, and Vthn is a threshold voltage of the NMOS transistor MN_1Y.

Conditions for electrical connection of the PMOS transistor MP_2Y may be expressed as Inequality 7:

$$Vy-Vout \geq |Vthp| \quad (7),$$

where Vthp is a threshold voltage of the PMOS transistor MP_2Y.

In order to enable electrical connection of the second current path 810Y', Inequalities 6 and 7 that are conditions for electrical connection of the NMOS transistor MN_1Y and the PMOS transistor MP_2Y need to be satisfied.

Thus, conditions for electrical connection of the second current path 810Y' may be expressed as Inequality 8:

$$Vin-Vout \geq Vthn+|Vthp| \quad (8)$$

On the conditions shown in Inequality 9, the second current path 810Y' is cut off.

$$Vin-Vout < Vthn+|Vthp| \quad (9)$$

Assuming that an absolute value of the threshold voltage of the PMOS transistors MP_2X and MP_2Y and the threshold voltage of the NMOS transistors MN_1X and MN_1Y are the same as Vth, if a voltage difference between the input voltage Vin and the output voltage Vout is less than 2Vth, both the first and second current paths 810X' and 810Y' are cut off. If the voltage difference between the input voltage Vin and the output voltage Vout is equal to or greater than 2Vth, selective electrical connection of the first current path 810X' or the second current path 810Y' is formed.

A current that flows through the first current path 810X' or the second current path 810Y' electrically connected, may be defined as a tail current. The tail current is added to the input bias current of the input circuit 510 by the transistors MP_3X, MN_3X, MP_3Y, and MN_3Y included in the first and second current mirror circuits 820X' and 820Y'.

Figure 10A:
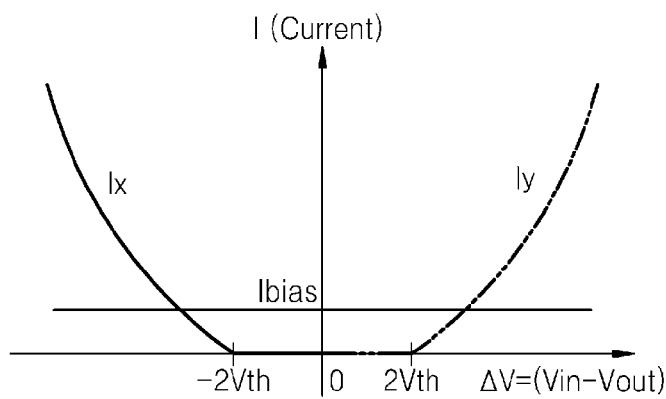
FIGS. 10A through 10D illustrate exemplary waveforms of primary signals that are generated in the circuit of FIG. 9.

A tail current Ix that is generated on the first current path 810X', and a tail current Iy that is generated on the second current path 810Y' according to the voltage difference between the input voltage Vin and the output voltage Vout of the amplifier for an output buffer that uses the self-bias circuit 410 illustrated in FIG. 9 are illustrated in FIG. 10A.

A current Ibias illustrated in FIG. 10A represents an input bias current that flows through the drain terminal of the NMOS transistor MN3 according to the second bias voltage VB2 as a DC bias voltage.

Figure 10B:
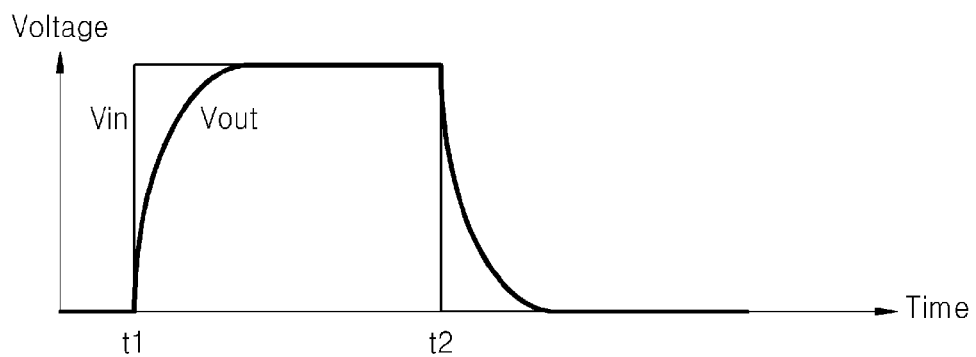

A waveform of the input voltage Vin that is a voltage of a signal input to the first input terminal IN1 of the amplifier for an output buffer that does not include the self-bias circuit 410 illustrated in FIG. 9, and a waveform of the output voltage Vout that is a voltage of a signal output to the output terminal OUT of the amplifier for an output buffer that does not include the self-bias circuit 410 of FIG. 9, are illustrated in FIG. 10B.

Figure 10C:
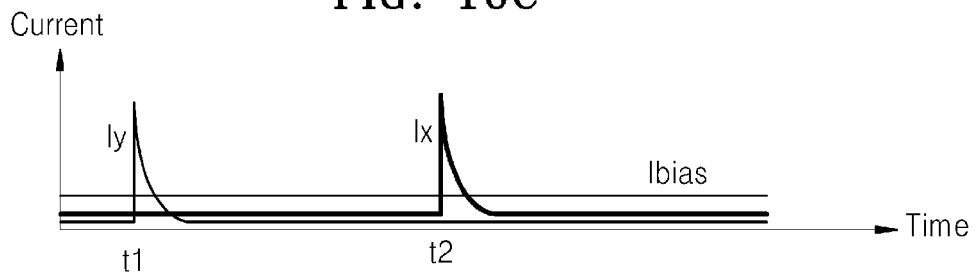

A waveform of the tail current Ix that is generated on the first current path 810X' and a waveform of the tail current Iy that is generated on the second current path 810Y' when the input voltage Vin illustrated in FIG. 10B is input to the first input terminal IN1 of the amplifier for an output buffer that includes the self-bias circuit 410 illustrated in FIG. 9, are illustrated in FIG. 10C.

Figure 10D:
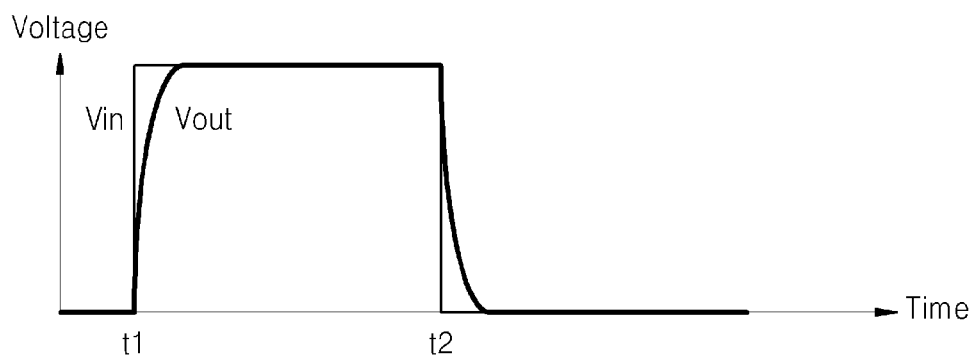

A waveform of the input voltage Vin and a waveform of the output voltage Vout of the amplifier for an output buffer that includes the self-bias circuit 410 illustrated in FIG. 9 are illustrated in FIG. 10D.

Referring to FIGS. 10B and 10D, FIG. 10B illustrates exemplary voltage waveforms of the input signal and the output signal in the amplifier for an output buffer that does not include the self-bias circuit 410 of FIG. 9, and FIG. 10D illustrates the voltage waveforms of the input signal and the output signal in the amplifier for an output buffer that includes the self-bias circuit 410 of FIG. 9. The output signal Vout of FIG. 10D may follow the input signal faster than the output signal Vout of FIG. 10B.

In addition, a slew rate of the amplifier for an output buffer that includes the self-bias circuit 410 illustrated in FIG. 9 may be expressed as Equation 10:

$$\text{Slew Rate} = (I_{DCbias} + I_{tail})/C_c \qquad (10),$$

where $I_{DCbias}$ is a DC bias current value that is generated by the DC bias voltage VB1 or VB2, $I_{tail}$ is a current that flows through the first current path 810X' or the second current path 810Y' of the self-bias circuit 410 of FIG. 9, and $C_c$ is a capacitance value of the capacitor C1 or C2 of the output circuit 530.

Referring to Inequality 1 and Equation 10, the slew rate of the amplifier for an output buffer that includes the self-bias circuit 410 of FIG. 9 may be improved compared to the slew rate of the amplifier for an output buffer that does not include the self-bias circuit 410 of FIG. 9.

Figure 11:
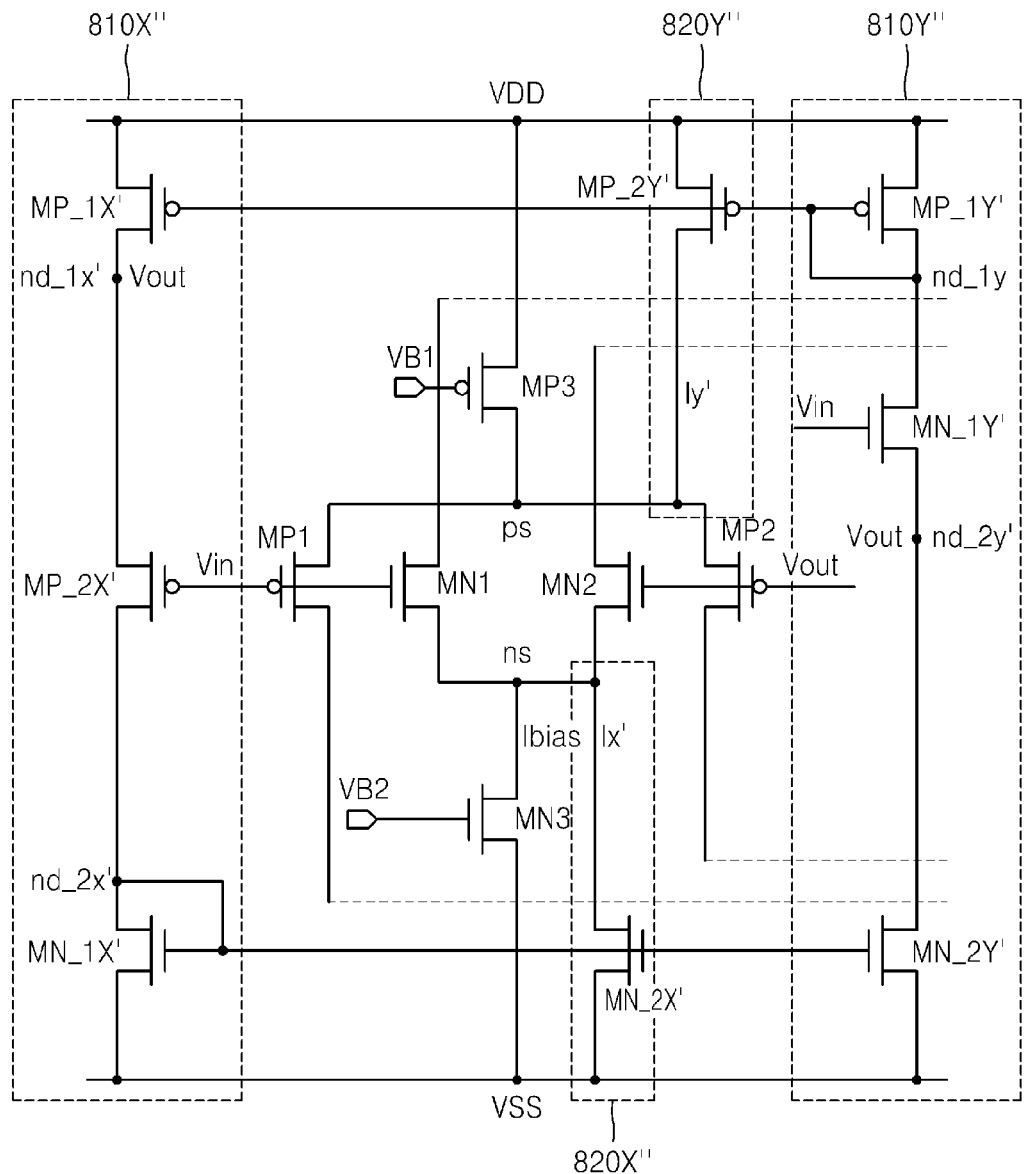
FIG. 11 illustrates a detailed circuit structure of the self-bias circuit of FIG. 4 that is connected to an input circuit of the operational amplifier of FIG. 4, according to another embodiment.

FIG. 11 illustrates a detailed circuit structure of the self-bias circuit 410 of FIG. 4 that is connected to the input circuit 510 of the operational amplifier 420 of FIG. 4, according to another embodiment. The input circuit of FIG. 5 is included in FIG. 11 for convenience of explanation.

In one embodiment, on a first current path 810X", three transistors, for example, PMOS transistors MP_1X' and MP_2X' and NMOS transistor MN_1X', are connected between the power rail VDD and the ground rail VSS in a cascade structure.

A source terminal of the PMOS transistor MP_1X' is connected to the power rail VDD, a gate terminal of the PMOS transistor MP_1X' is connected to a node nd_1y', a drain terminal of the PMOS transistor MP_1X' is connected to a node nd_1x', a source terminal of the PMOS transistor MP_2X' is connected to the node nd_1x', a drain terminal of the PMOS transistor MP_2X' is connected to a node nd_2x', a gate terminal of the PMOS transistor MP_2X' is connected to the first input terminal IN1, a gate terminal and a drain terminal of the NMOS transistor MN_1X' are connected to the node nd_2x', and a source terminal of the NMOS transistor MN_1X' is connected to the ground rail VSS. The second input terminal IN2 is connected to the node nd_1x'.

Since the input voltage Vin is applied to the first input terminal IN1 and the output voltage Vout is applied to the second input terminal IN2, the input voltage Vin is applied to the gate terminal of the PMOS transistor MP_2X', and the output voltage Vout is applied to the node nd_1x' as the source terminal of the PMOS transistor MP_2X'.

In one embodiment, on a second current path 810Y", three transistors, for example, a PMOS transistor MP_1Y' and NMOS transistors MN_1Y' and MN_2Y', are connected between the power rail VDD and the ground rail VSS in a cascade structure.

A source terminal of the PMOS transistor MP_1Y' is connected to the power rail VDD, a gate terminal and a drain terminal of the PMOS transistor MP_1Y' are connected to the node nd_1y', a drain terminal of the NMOS transistor MN_1Y' is connected to the node nd_1y', a source terminal of the NMOS transistor MN_1Y' is connected to a node nd_2y', a gate terminal of the NMOS transistor MN_1Y' is connected to the first input terminal IN1, a gate terminal of an NMOS transistor MN_2Y' is connected to the node nd_2x', a drain terminal of the NMOS transistor MN_2Y' is connected to the node nd_2y', and a source terminal of the NMOS transistor MN_2Y' is connected to the ground rail VSS. The second input terminal IN2 is connected to the node nd_2y'.

Since the input voltage Vin is applied to the first input terminal IN1 and the output voltage Vout is applied to the second input terminal IN2, the input voltage Vin is applied to a gate terminal of the NMOS transistor MN_1Y', and the output voltage Vout is applied to the node nd_2Y' as the source terminal of the NMOS transistor MN_1Y'.

An NMOS transistor MN_2X' of a first current mirror circuit 820X" that is combined with the NMOS transistor MN_1X' of the first current path 810X" adds the tail current that is generated on the first current path 810X" to the input bias current of the input circuit 510.

In detail, a source terminal of the NMOS transistor MN_2X' is connected to the ground rail VSS, a gate terminal of the NMOS transistor MN_2X' is connected to the node nd_2x', and a drain terminal of the NMOS transistor MN_2X' is connected to a node ns.

A bias current caused by the second bias voltage VB2 and a tail current that is metered by the NMOS transistor MN_2X' are applied to the node ns. Thus, the tail current may be added to the bias current caused by the second bias voltage VB2.

In one embodiment, a PMOS transistor MP_2Y' of a second current mirror circuit 820Y" that is combined with the PMOS transistor MP_1Y' of the second current path 810Y" adds the tail current that is generated on the second current path 810Y" to the input bias current of the input circuit 510.

In detail, a source terminal of the PMOS transistor MP_2Y' is connected to the power rail VDD, a gate terminal of the PMOS transistor MP_2Y' is connected to the node nd_1y', and a drain terminal of the PMOS transistor MP_2Y' is connected to a node ps.

A bias current caused by the first bias voltage VB1 and a tail current that is metered by the PMOS transistor MP_2Y' are applied to the node ps. Thus, the tail current may be added to the bias current caused by the first bias voltage VB1.

On the first current path 810X", electrical connection of the PMOS transistor MP_2X' is formed when conditions shown in Inequality 11 are satisfied.

$$Vout - Vin \geq |Vthp| \qquad (11),$$

where Vthp is a threshold voltage of the PMOS transistor MP_2X'.

On the second current path 810Y", electrical connection of the NMOS transistor MN_1Y' is formed when conditions shown in Inequality 12 are satisfied.

$$Vin - Vout \geq Vthn \qquad (12),$$

where Vthn is a threshold voltage of the NMOS transistor MN_1Y'.

Assuming that an absolute value of a threshold voltage of the PMOS transistor MP_2X' and a threshold voltage of the NMOS transistor MN_1Y' are the same as Vth, if a voltage difference between the input voltage Vin and the output voltage Vout is less than Vth, both the first and second current paths 810X" and 810Y" are cut off. If the voltage difference between the input voltage Vin and the output voltage Vout is equal to or greater than Vth, selective electrical connection of the first current path 810X" or the second current path 810Y" is formed.

If electrical connection of the first current path 810X" or the second current path 810Y" is formed, the tail current flows through the first current path 810X" or the second current path 810Y". The tail current is added to the input bias current of the input circuit 510 by the PMOS transistors MP_2X' and MP_2Y' included in the first and second current mirror circuits 820X'' and 820Y''.

Figure 12A:
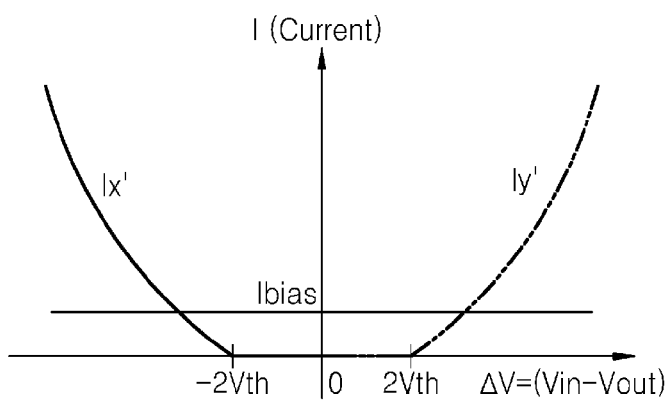
FIGS. 12A through 12D illustrate exemplary waveforms of primary signals that are generated in the circuit of FIG. 11.

A tail current Ix' that is generated on the first current path 810X'', and a tail current Iy' that is generated on the second current path 810Y'' according to the voltage difference between the input voltage Vin and the output voltage Vout of the amplifier for an output buffer that uses the self-bias circuit 410 illustrated in FIG. 11 are illustrated in FIG. 12A.

A current Ibias illustrated in FIG. 12A represents an input bias current that flows through the drain terminal of the PMOS transistor MP3 by the first bias voltage VB1 as a DC bias voltage, or an input bias current that flows through the drain terminal of the NMOS transistor MN3 by the second bias voltage VB2.

Figure 12B:
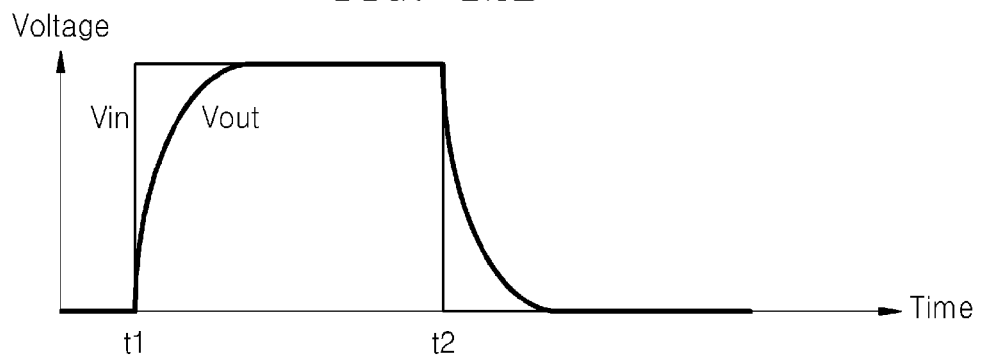

A waveform of the input voltage Vin that is a voltage of a signal input to the first input terminal IN1 of the amplifier for an output buffer that does not include the self-bias circuit 410 illustrated in FIG. 11, and a waveform of the output voltage Vout that is a voltage of a signal output to the output terminal OUT of the amplifier for an output buffer that does not include the self-bias circuit 410 of FIG. 11 are illustrated in FIG. 12B.

Figure 12C:
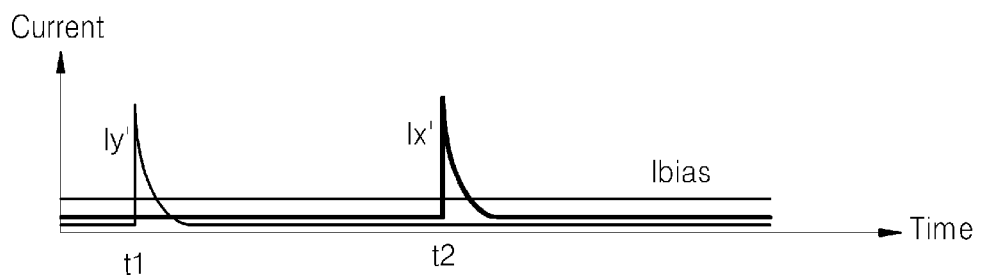

A waveform of the tail current Ix' that is generated on the first current path 810X'' and a waveform of the tail current Iy' that is generated on the second current path 810Y'' when the input voltage Vin illustrated in FIG. 12B is input to the first input terminal IN1 of the amplifier for an output buffer that includes the self-bias circuit 410 illustrated in FIG. 11 are illustrated in FIG. 12C.

Figure 12D:
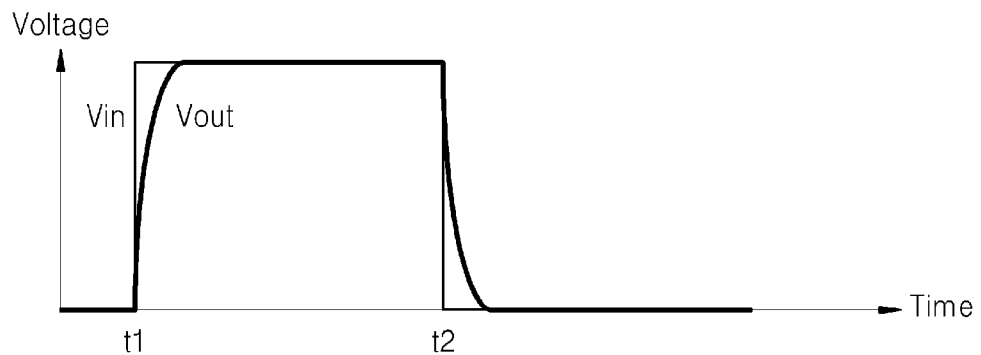

A waveform of the input voltage Vin and a waveform of the output voltage Vout of the amplifier for an output buffer that includes the self-bias circuit 410 illustrated in FIG. 11 are illustrated in FIG. 12D.

Referring to FIGS. 12B and 12D, FIG. 12B illustrates exemplary voltage waveforms of the input signal and the output signal in the amplifier for an output buffer that does not include the self-bias circuit 410 of FIG. 11, and FIG. 12D illustrate the voltage waveforms of the input signal and the output signal, in the amplifier for an output buffer that includes the self-bias circuit 410 of FIG. 11. The output signal Vout of FIG. 12D may follow the input signal faster than the output signal Vout OF FIG. 12B.

The slew rate of the amplifier for an output buffer may be improved by the tail current Ix' that is generated on the first current path 810X'' and the tail current Iy' that is generated on the second current path 810Y''.

The self-bias circuit 410 that is implemented with MOS transistors is illustrated in FIGS. 9 and 11, however, the self-bias circuit 410 may be implemented with bipolar transistors.

As described above, in one embodiment, one or more of the circuits described above may be used in a system that includes a display panel. For example, the various described embodiments could be used in a smart phone, a tablet, a laptop computer, a television, or other device that uses a display panel. The display panel may be, for example, an LCD, LED, or other type of display panel.

While the disclosure has been particularly shown and described with reference to exemplary embodiments thereof, it will be understood that various changes in form and details may be made therein without departing from the spirit and scope of the following claims.

What is claimed is:

1. An amplifier for an output buffer, the amplifier comprising:
an operational amplifier comprising a first input terminal, a second input terminal, and an output terminal, the operational amplifier configured to generate an input bias current and amplify a voltage difference between signals applied to the first input terminal and the second input terminal, and to output the amplified voltage difference; and
a self-bias circuit connected to the first input terminal and the second input terminal, the self-bias circuit configured to generate a first current flowing on a first current path and a second current flowing on a second current path when the voltage difference between signals applied to the first input terminal and the second input terminal is equal to or greater than a predetermined voltage, to generate a tail current on the first or second current path, and to add the generated tail current to the input bias current of the operational amplifier,
wherein the second input terminal is connected to the output terminal.

2. The amplifier of claim 1, wherein the first current and the second current are not generated when the voltage difference between signals applied to the first input terminal and the second input terminal is less than the predetermined voltage.

3. The amplifier of claim 1, wherein the self-bias circuit adds the tail current that is generated on the first or second current path to the input bias current of the operational amplifier by using a current mirror circuit.

4. The amplifier of claim 1, wherein each of the first and second current paths includes a plurality of transistors connected between a power rail and a ground rail in a cascade structure, and
wherein the transistors include at least one pair of an NMOS transistor and a PMOS transistor connected in series, the NMOS and PMOS transistors sharing a source terminal.

5. The amplifier of claim 4, wherein a drain terminal of the NMOS transistor is connected to a first node, and a drain terminal of the PMOS transistor is connected to a second node that is closer to the ground rail than the first node.

6. The amplifier of claim 4, wherein a gate terminal of the NMOS transistor of the second current path is connected to the first input terminal and a gate terminal of the PMOS transistor of the second current path is connected to the second input terminal, and
wherein a gate terminal of the NMOS transistor of the first current path is connected to the second input terminal and a gate terminal of the PMOS transistor of the first current path is connected to the first input terminal.

7. The amplifier of claim 1, wherein each of the first and second current paths includes a set of four transistors connected between a power rail and a ground rail in a cascade structure,
wherein the set of four transistors includes a source terminal of a first PMOS transistor connected to the power rail, a gate terminal and a drain terminal of the first PMOS transistor connected to a first node, a drain terminal of a first NMOS transistor connected to the first node, a source terminal of the first NMOS transistor connected to a third node, a source terminal of a second PMOS transistor connected to the third node, a drain terminal of the second PMOS transistor connected to a second node, a gate terminal and a drain terminal of the second NMOS transistor connected to the second node, and a source terminal of the second NMOS transistor connected to the ground rail, and
wherein the first input terminal is connected to the gate terminal of the first NMOS transistor or the gate terminal of the second PMOS transistor.

8. The amplifier of claim 7, wherein the gate terminal of the first NMOS transistor of the first current path is connected to the second input terminal and the gate terminal of the second PMOS transistor of the first current path is connected to the first input terminal, and wherein the gate terminal of the first NMOS transistor of the second current path is connected to the first input terminal and the gate terminal of the second PMOS transistor of the second current path is connected to the second input terminal.

9. The amplifier of claim 7, wherein the self-bias circuit further comprises a third PMOS transistor and a third NMOS transistor for current mirroring, and wherein a gate terminal of the third PMOS transistor is connected to the first node, a source terminal of the third PMOS transistor is connected to the power rail, a drain terminal of the third PMOS transistor is connected to a node to which a first input bias current of the operational amplifier is applied, a gate terminal of the third NMOS transistor is connected to the second node, a source terminal of the third NMOS transistor is connected to the ground rail, and a second input bias current of the operational amplifier is applied to a drain terminal of the third NMOS transistor.

10. The amplifier of claim 1, wherein each of the first and second current paths includes a plurality of transistors connected between a power rail and a ground rail in a cascade structure, and wherein the first input terminal is connected to a gate terminal of a first transistor of the transistors, and the second input terminal is connected to a source terminal of the first transistor.

11. The amplifier of claim 10, wherein the first current path includes a first set of three transistors connected between the power rail and the ground rail in a cascade structure, wherein the first set of three transistors includes a source terminal of a first PMOS transistor connected to the power rail, a drain terminal of the first PMOS transistor connected to a first node, a gate terminal of the first PMOS transistor connected to a third node, a source terminal of a second PMOS transistor connected to the first node, a drain terminal of the second PMOS transistor connected to a second node, a gate terminal of the second PMOS transistor connected to the first input terminal, a gate terminal and a drain terminal of the first NMOS transistor connected to the second node, a source terminal of the first NMOS transistor connected to the ground rail, and the second input terminal connected to the first node, wherein the second current path includes a second set of three transistors connected between the power rail and the ground rail in a cascade structure, and wherein the second set of three transistors includes a source terminal of a third PMOS transistor connected to the power rail, a gate terminal and a drain terminal of the third PMOS transistor connected to the third node, a drain terminal of the second NMOS transistor connected to the third node, a source terminal of the second NMOS transistor connected to a fourth node, a gate terminal of the second NMOS transistor connected to the first input terminal, a drain terminal of the third NMOS transistor connected to the fourth node, a source terminal of the third NMOS transistor connected to the ground rail, a gate terminal of the third NMOS transistor connected to the second node, and the second input terminal connected to the fourth node.

12. The amplifier of claim 11, wherein the self-bias circuit further comprises a fourth PMOS transistor and a fourth NMOS transistor for current mirroring, and wherein a gate terminal of the fourth PMOS transistor is connected to the third node, a source terminal of the fourth PMOS transistor is connected to the power rail, a drain terminal of the fourth PMOS transistor is connected to a node to which a first input bias current of the operational amplifier is applied, a gate terminal of the fourth NMOS transistor is connected to the second node, a source terminal of the fourth NMOS transistor is connected to the ground rail, and a second input bias current of the operational amplifier is applied to a drain terminal of the fourth NMOS transistor.

13. The amplifier for an output buffer of claim 1, wherein the operational amplifier further comprises:

an input circuit configured to output a differential current according to a voltage difference between signals applied to the first input terminal and the second input terminal based on an input bias current to which the tail current is added;

an amplifying circuit configured to add the differential current and to amplify a voltage caused by the added current; and an output circuit configured to output the amplified voltage.

14. The amplifier of claim 13, wherein the input circuit comprises a first pair of differential amplifying transistors that are connected to a first branch through which a first bias current flows, and a second pair of differential amplifying transistors that are connected to a second branch through which a second bias current flows, and the input circuit connects a branch through which the tail current flows to the first branch or the second branch in parallel.

15. A signal processing apparatus comprising:

a digital-to-analog converter (DAC) configured to convert a digital image signal into an analog image signal; and an amplifier for an output buffer configured to amplify the analog image signal and to supply the amplified analog image signal to a display panel, wherein the amplifier comprises:

an operational amplifier comprising a first input terminal, a second input terminal, and an output terminal, the operational amplifier configured to generate an input bias current and amplify a voltage difference between signals applied to the first input terminal and the second input terminal, and to output the amplified voltage difference; and a self-bias circuit connected to the first input terminal and the second input terminal, the self-bias circuit configured to generate a first current flowing on a first current path and a second current flowing on a second current path when the voltage difference between signals applied to the first input terminal and the second input terminal is equal to or greater than a predetermined voltage, to generate a tail current on the first or second current path, and to add the generated tail current to the input bias current of the operational amplifier, and wherein the second input terminal is connected to the output terminal.

16. An amplifier circuit of a semiconductor device, the circuit comprising:

an operational amplifier comprising an input circuit including a first input terminal, a second input terminal, a first node, and a second node, and an output terminal, the operational amplifier configured to amplify a voltage difference between a first input voltage applied to the first input terminal and a second input voltage applied to the second input terminal, and configured to output the amplified voltage difference through the output terminal;

a first self-bias circuit connected to the first input terminal, the second input terminal, the first node, and the second node, the first self-bias circuit configured to generate a first current flowing on a first current path when a second input voltage applied to the second input terminal is greater than a first input voltage applied to the first input terminal; and a second self-bias circuit connected to the first input terminal, the second input terminal, the first node, and the second node, the second self-bias circuit configured to generate a second current flowing on a second current path when a first input voltage applied to the first input terminal is greater than a second input voltage applied to the second input terminal, wherein the second input terminal is connected to the output terminal.

17. The circuit of claim 16, wherein the input circuit is configured to convert voltage difference between the first and second input voltages into a current.

18. The circuit of claim 17, wherein the first self-bias circuit includes a first NMOS transistor connected to the second input voltage, and a first PMOS transistor connected to the first input voltage, and wherein the second self-bias circuit includes a second NMOS transistor connected to the first input voltage, and a second PMOS transistor connected to the second input voltage.

19. The circuit of claim 16, wherein the first current and the second current are not generated when the voltage difference between the first and second input voltage is smaller than a predetermined voltage.

20. The circuit of claim 19, wherein a level of the predetermined voltage is equal to a value of summation of a threshold voltage of the first NMOS transistor and an absolute value of a threshold voltage of the first PMOS transistor, or equal to a value of summation of a threshold voltage of the second NMOS transistor and an absolute value of a threshold voltage of the second PMOS transistor.

* * * * *